United States Patent
Sandhu et al.

(10) Patent No.: US 6,939,817 B2
(45) Date of Patent: Sep. 6, 2005

(54) REMOVAL OF CARBON FROM AN INSULATIVE LAYER USING OZONE

(75) Inventors: Gurtej S. Sandhu, Boise, ID (US); Li Li, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 83 days.

(21) Appl. No.: 10/435,569

(22) Filed: May 8, 2003

(65) Prior Publication Data

US 2004/0224510 A1 Nov. 11, 2004

(51) Int. Cl.$^7$ ................................ H01L 21/31
(52) U.S. Cl. ............... 438/789; 438/787; 438/788; 438/790
(58) Field of Search ............... 438/787, 788, 438/789, 790

(56) References Cited

U.S. PATENT DOCUMENTS

| | | | |
|---|---|---|---|
| 5,320,983 A | | 6/1994 | Ouellet |
| 5,518,950 A | * | 5/1996 | Ibok et al. ............ 438/435 |
| 6,114,219 A | * | 9/2000 | Spikes et al. ......... 438/428 |
| 6,221,780 B1 | * | 4/2001 | Greco et al. .......... 438/702 |
| 6,287,990 B1 | | 9/2001 | Cheung et al. |
| 6,297,175 B1 | | 10/2001 | Iyer |
| 6,383,951 B1 | | 5/2002 | Li |
| 2002/0164429 A1 | | 11/2002 | Gaillard et al. |
| 2004/0152342 A1 | * | 8/2004 | Li et al. ................ 438/789 |

FOREIGN PATENT DOCUMENTS

| | | |
|---|---|---|
| EP | 1077477 A1 | 2/2001 |
| JP | 01057626 | 3/1989 |

OTHER PUBLICATIONS

Chung et al , "Novel Shallow Trends Isolation Process Using Flowable Oxide CVD for Sub–100nm DRAM". IEEE, 2002, 4 pages.

International Search Report dated Oct. 12, 2004 7 pages.

* cited by examiner

*Primary Examiner*—Andy Huynh
(74) *Attorney, Agent, or Firm*—TraskBritt (57) ABSTRACT

A method of removing residual carbon deposits from a flowable, insulative material. The flowable, insulative material comprises silicon, carbon, and hydrogen and is a flowable oxide material or a spin-on, flowable oxide material. The residual carbon deposits are removed from the flowable, insulative material by exposing the material to ozone. The flowable, insulative material is used to form an insulative layer in a trench located on a semiconductor substrate.

57 Claims, 5 Drawing Sheets

REMOVAL OF CARBON FROM AN INSULATIVE LAYER USING OZONE

BACKGROUND OF THE INVENTION

1. Field of the Invention

The present invention relates to a method of manufacturing a semiconductor device and, more specifically, to a method of removing residual carbon deposits from an intermediate semiconductor device structure.

2. State of the Art

Performance of semiconductor devices has increased dramatically over the past few years as a result of increased circuit density on a semiconductor substrate. As the density of the semiconductor devices has increased, it has become necessary to decrease the size of circuit components that form the semiconductor devices so that the necessary number of circuit components is able to fit on the semiconductor substrate.

Semiconductor devices typically include the semiconductor substrate and a plurality of adjacent, active devices that are electrically isolated from one another. With the increased circuit density, effective isolation between active devices becomes increasingly important. One isolation technique is local oxidation of silicon isolation ("LOCOS"), which forms a recessed oxide layer in nonactive regions of the semiconductor substrate to isolate the active devices. The oxide layer is formed by sputtering techniques or thermal techniques.

An alternative technique is trench isolation, which involves etching trenches in the nonactive regions of the semiconductor substrate. Trench isolation is referred to as shallow trench isolation ("STI") or deep trench isolation ("DTI"), depending on the depth of the trench etched in the semiconductor substrate. DTI structures, which typically have a depth of greater than approximately 3 microns, are used to isolate active devices such as N-wells and P-wells. Shallow trench structures are used to isolate adjacent electronic devices, such as transistors, and have a depth of less than approximately 1 micron. The trenches are filled with an insulative dielectric material, such as a silicon dioxide material. The filled trenches are known in the art as trench isolation or trench isolation regions. The trench is typically filled with the silicon dioxide material by a chemical vapor deposition ("CVD") technique, such as high density plasma ("HDP") CVD. In CVD, gaseous precursors of the silicon dioxide material are supplied to a surface of the semiconductor substrate. The gaseous precursors react with the surface to form a film or layer of the silicon dioxide material.

Trench isolation provides a smaller isolation area and better surface planarization than LOCOS. While trench isolation provides these advantages, undesirable voids are formed in the silicon dioxide material as the trench fills because the silicon dioxide material sticks to the sides and sidewalls of the trench, rather than evenly filling the trench from the bottom to the top. Voids are especially common in deep trenches, such as trenches having a high aspect ratio of greater than approximately 3:1. Voids also commonly form at later stages of the filling process because the trenches, both deep and shallow, become narrower as they fill.

As disclosed in Chung et al., "Novel shallow trench isolation process using flowable oxide CVD for sub-100 nm DRAM," IEEE (2002), CVD of flowable oxide materials has been used in combination with HDP CVD to reduce the formation of voids. A liquid $Si(OH)_4$ film is formed in the trench by supplying silane and hydrogen peroxide ("$H_2O_2$") to a surface of the substrate. The $Si(OH)_4$ film is covered with an HDP oxide to protect the $Si(OH)_4$ film from severe cleaning conditions.

In addition to being used in shallow trenches, CVD of flowable oxide materials is useful to fill trench structures having a high aspect ratio. While depositing the flowable oxide material by CVD reduces the formation of voids, residual carbon deposits are present in the deposited film if the gaseous precursors contain carbon. Carbon in the deposited film causes the film to be soft and porous, which makes the deposited film unstable during subsequent processing, such as etching processes. Since the deposited film is porous, due to the presence of the carbon, it also tends to collapse. In addition, if the flowable oxide material is used to fill isolation trenches, the carbon causes device degradation.

It would be desirable to reduce or eliminate the residual carbon deposits present in deposited layers of flowable oxide materials.

BRIEF SUMMARY OF THE INVENTION

The present invention comprises a method of removing residual carbon deposits. The method includes providing an insulative material that is flowable after being deposited. The flowable, insulative material may comprise silicon, carbon, and hydrogen. Residual carbon deposits may be removed from the flowable, insulative material by exposing the material to ozone ("$O_3$"). The flowable, insulative material may be exposed to $O_3$ at a temperature of between approximately 100° C. and 1000° C. A concentration of $O_3$ greater than approximately 1% may be used. The flowable, insulative material is used to form an insulative layer in a trench located on a semiconductor substrate.

The present invention also includes an intermediate semiconductor device structure. The intermediate semiconductor device structure comprises a semiconductor substrate having at least one cavity or recess therein, such as a trench, filled with a flowable, insulative material free of residual carbon deposits.

BRIEF DESCRIPTION OF THE SEVERAL VIEWS OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE INVENTION

A method of removing residual carbon deposits from an insulative material is disclosed. The insulative material is used as a gap fill material, such as to fill a trench on a semiconductor substrate. The insulative material is deposited into the trench to form an insulative layer, which includes residual carbon deposits. These residual carbon deposits are removed by exposing the insulative layer to $O_3$.

Figure 1A:
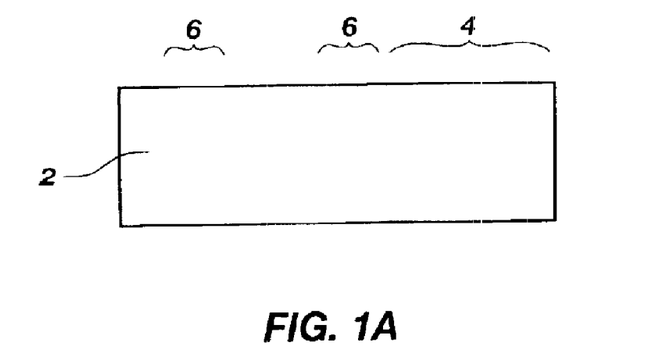
FIGS. 1A–1C are cross-sectional views of an intermediate semiconductor device structure according to the present invention.

The semiconductor substrate may be a semiconductor wafer or other substrate comprising a layer of semiconductor material. As used herein, the term "semiconductor substrate" includes silicon wafers, silicon on insulator ("SOI") substrates, silicon on sapphire ("SOS") substrates, epitaxial layers of silicon on a base semiconductor foundation, and other semiconductor materials such as silicon-germanium, germanium, gallium arsenide and indium phosphide. As shown in FIG. 1A, the semiconductor substrate 2 may include a plurality of active regions 4 and a plurality of nonactive regions 6. Active devices, such as transistors, may be formed on the active regions 4 while at least one trench 8 may be formed on the nonactive regions 6 to separate and isolate the active devices. The term "trench" is used herein in its broadest sense of a recess or cavity and is not to be construed as requiring any specific configuration or dimension. As such, the trench may be either a shallow trench or a deep trench.

Figure 1B:
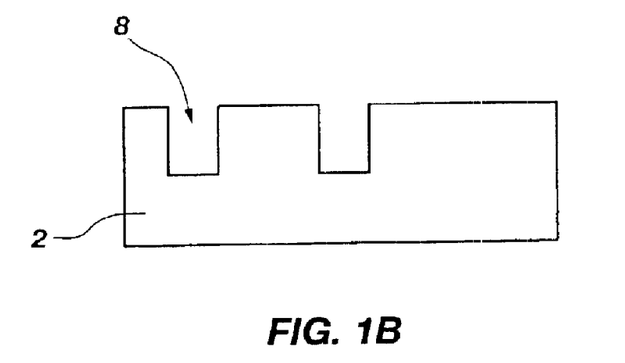
Figure 1C:
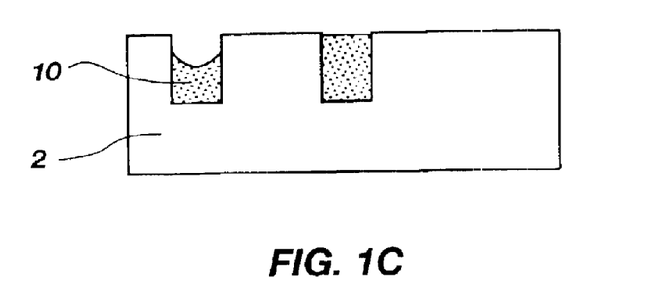

As illustrated in FIG. 1B, the trench 8 may be formed in the nonactive regions 6 of the semiconductor substrate 2 by conventional techniques, such as by etching the semiconductor substrate 2 and any additional layers overlying the semiconductor substrate 2. As is known in the art, additional layers may be present on the semiconductor substrate 2 depending on the nature of an ultimate semiconductor device structure that is to be formed. For sake of example only, photoresist layers, pad oxide layers, and/or nitride layers may be present on the semiconductor substrate 2. As shown in FIG. 1C, an insulative layer 10 may completely or partially fill the trench 8. The insulative layer 10 may be deposited at a thickness ranging from approximately 50 Å to approximately 8000 Å, such as a thickness of approximately 300 Å to approximately 3000 Å.

The insulative layer 10 may be formed from a flowable oxide material that is deposited by CVD. Alternatively, the insulative layer 10 may be formed from a spin-on, flowable oxide material that is deposited in the trench 8. The insulative layer 10 may have fluid characteristics similar to that of a spin-on glass film at the moment of deposition. For instance, the insulative layer 10 may have properties similar to those of a sol gel or a spin-on material. As such, the insulative layer 10 is soft and porous. Since the deposited insulative layer 10 is fluid-like, the material may not adhere to the sidewalls or the top of the trench 8 and, instead, fills the trench 8 from the bottom to the top of the trench 8. If the trench 8 is partially filled with the flowable oxide material, it is understood that the remainder of the trench 8 may be filled with an HPD oxide deposited by HDP CVD.

If the insulative layer 10 is to be formed by CVD, the semiconductor substrate 2 may be placed in a reaction chamber and the gaseous precursors flowed over the semiconductor substrate 2 and into the trench 8. The gaseous precursors may include an organic silicon precursor and an oxidizing agent, both of which are gaseous at, or near, a temperature at which the insulative layer 10 is deposited. The organic silicon precursor may include silicon, carbon, hydrogen, and, optionally, oxygen or nitrogen. For instance, the organic silicon precursor may be an organosilane, such as an alkylsilane or an alkenylsilane, or an organosiloxane compound. The alkylsilane may include, but is not limited to, a methylsilane, dimethylsilane, trimethylsilane ("TMS"), or tetramethylsilane. It is also contemplated that a mixture of two or more organic silicon precursors may be used. $O_3$, $H_2O_2$, oxygen ("$O_2$"), or other compounds capable of oxidizing the organic silicon precursor and/or removing electrons therefrom may be used as the oxidizing agent.

For sake of example only, the insulative layer 10 may be formed by flowing TMS and $O_3$ into the reaction chamber and over the trench 8. The TMS and $O_3$ react with the surface of the semiconductor substrate 2 lining the trench 8 to form the insulative layer 10. The semiconductor substrate 2 may be maintained at a temperature ranging from approximately 25° C. to approximately 500° C. by placing the semiconductor substrate 2 on a chuck maintained at that temperature. For instance, the semiconductor substrate 2 may be maintained at a temperature of approximately 125° C. The reaction chamber may be maintained at a pressure ranging from approximately 10 Torr to approximately 600 Torr, such as at approximately 300 Torr.

The insulative layer 10 deposited by CVD may include the residual carbon deposits if the carbon in the organic silicon precursor is not completely oxidized during the CVD process. The insulative layer 10 may include up to approximately 30% carbon. The presence of carbon causes the insulative layer 10 to be soft and porous, which may lead to collapse of the insulative layer 10 under certain conditions. In addition, when the insulative layer 10 is used to fill trenches, the carbon may cause degradation in any semiconductor device structures that include the insulative material.

The residual carbon deposits may be removed from the insulative layer 10 by exposing the insulative layer 10 to $O_3$. The $O_3$ may be introduced or flowed into the reaction chamber so that the $O_3$ contacts the insulative layer 10 in the trench 8 for a sufficient amount of time to remove the residual carbon. Since the insulative layer 10 is porous, the $O_3$ may permeate the layer and come into contact with the residual carbon deposits. Without being limited to a certain theory, it is believed that the $O_3$ oxidizes the residual carbon deposits to produce volatile carbon species, such as carbon monoxide ("CO") or carbon dioxide ("$CO_2$"). These volatile carbon species subsequently diffuse out of the insulative layer 10. The exposure to $O_3$ may dramatically reduce the amount of residual carbon present in the insulative layer 10 to less than approximately 5% (atomic). For instance, the amount of residual carbon may be reduced to less than approximately 2% (atomic). It is also contemplated that the insulative layer 10 may be substantially free of residual carbon, such as having less than approximately 1% (atomic) residual carbon. While the insulative layer 10 has less than approximately 5% (atomic) residual carbon, it is understood that a surface of the insulative layer 10 may have a higher amount of residual carbon, as explained below, due to absorption of carbon from the atmosphere after the $O_3$ treatment.

During the exposure to $O_3$, the semiconductor substrate 2 may be maintained at a temperature ranging from approximately 0°0 C. to approximately 1000° C. For sake of example only, the semiconductor substrate 2 may be maintained at a temperature ranging from approximately 400° C. to approximately 700° C. The $O_3$ may be flowed into the reaction chamber in combination with an inert carrier gas, such as helium, neon, or argon. The $O_3$ may be flowed into the reaction chamber at a rate of at least 10 standard cubic centimeters per minute ("sccm") and up to a rate of approximately 20,000 sccm. The $O_3$ may be present in the reaction chamber at a concentration greater than approximately 1%, such as at a concentration greater than approximately 12% or greater than approximately 17%. The insulative layer 10 may be exposed to the $O_3$ for between approximately 20 seconds and approximately 300 seconds. To improve the amount of carbon removed from the insulative layer 10, the $O_3$ concentration and/or the $O_3$ flow rate may be increased. In addition, the length of time to which the insulative layer 10 is exposed to $O_3$ may be increased.

In one embodiment, the $O_3$ is flowed into the reaction chamber, maintained at approximately 530° C., at a rate of approximately 2,000 sccm to approximately 5,000 sccm. The $O_3$ is supplied to the reaction chamber at a concentration of approximately 12%. To remove the residual carbon, the insulative layer 10 may be exposed to the $O_3$ for as little as approximately 20 seconds.

The removal of the residual carbon deposits from the insulative layer 10 may also proceed in a sequential fashion. For instance, a first portion of the insulative layer 10 may be deposited, as described above, in the trench 8. $O_3$ may be flowed over the first portion of the insulative layer 10 to remove the residual carbon deposits. A second portion of the insulative layer 10 may subsequently be deposited and exposed to $O_3$ to remove the residual carbon deposits in the second portion. The sequential process may be repeated until the trench 8 is filled to a desired level by the insulative layer 10.

Figure 2:
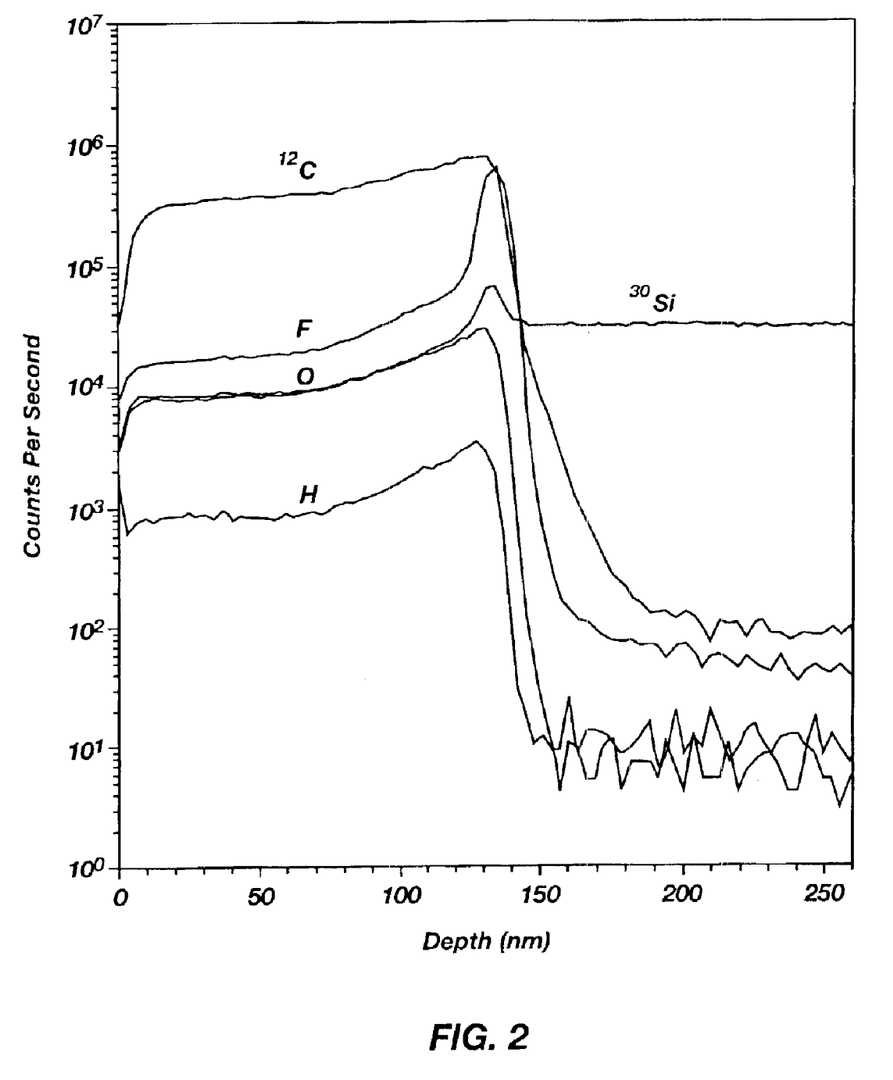
FIGS. 2, 3, 4, and 5 show carbon levels of untreated insulative layers and insulative layers treated with $O_3$.
Figure 3:
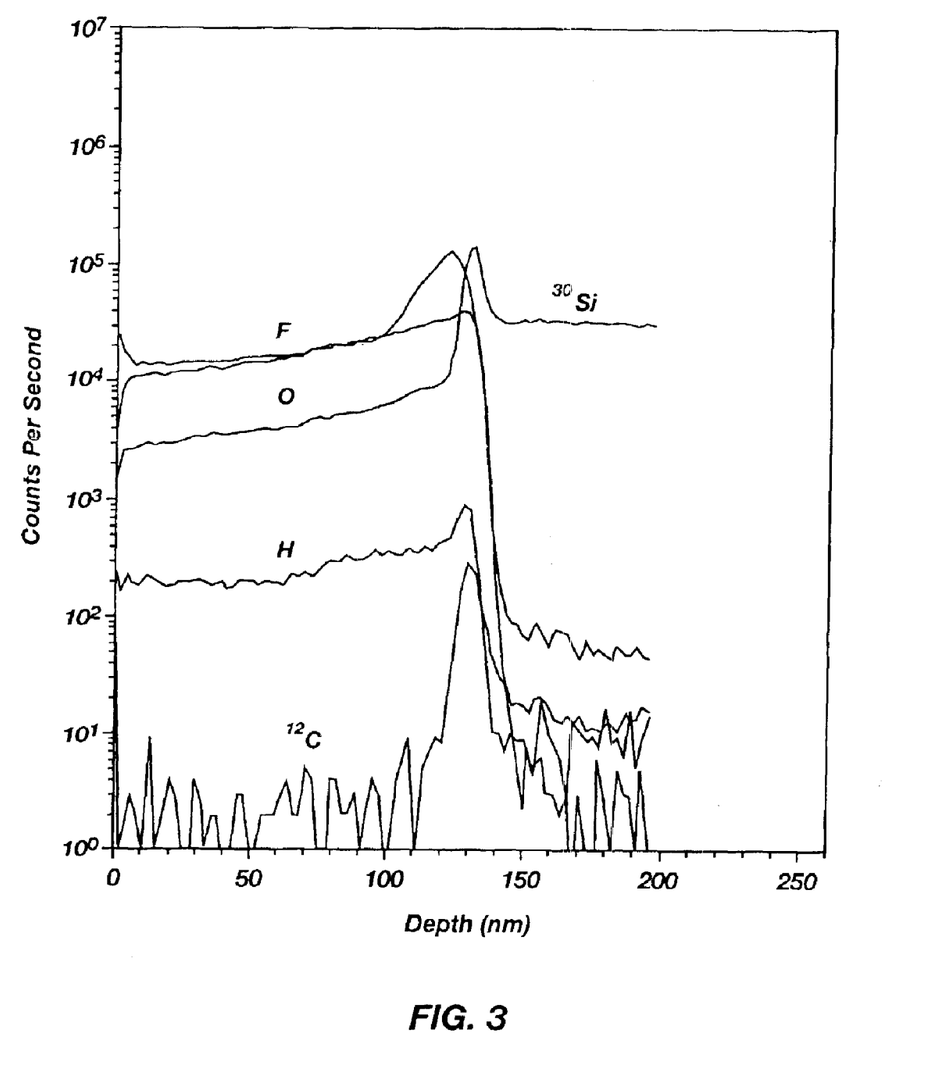

To determine the amount of carbon present in insulative layers 10 that were exposed to $O_3$, insulative layers 10 were deposited on a blanket wafer by CVD of TMS and $O_3$ at a temperature of 530° C. The insulative layers 10 were deposited at a thickness of approximately 600 Å. Insulative layers 10 that were exposed to $O_3$ had significantly reduced amounts of carbon compared to insulative layers 10 that were not exposed to $O_3$. As shown in FIGS. 2 and 3, which are secondary ion mass spectrometry ("SIMS") analyses of insulative layers 10 deposited as described above, the insulative layer 10 that was not exposed to $O_3$ had a dramatically higher level of carbon (shown in FIG. 2) compared to the insulative layer 10 that was exposed to $O_3$ for 100 seconds (shown in FIG. 3). The latter showed a background level of carbon.

Figure 4:
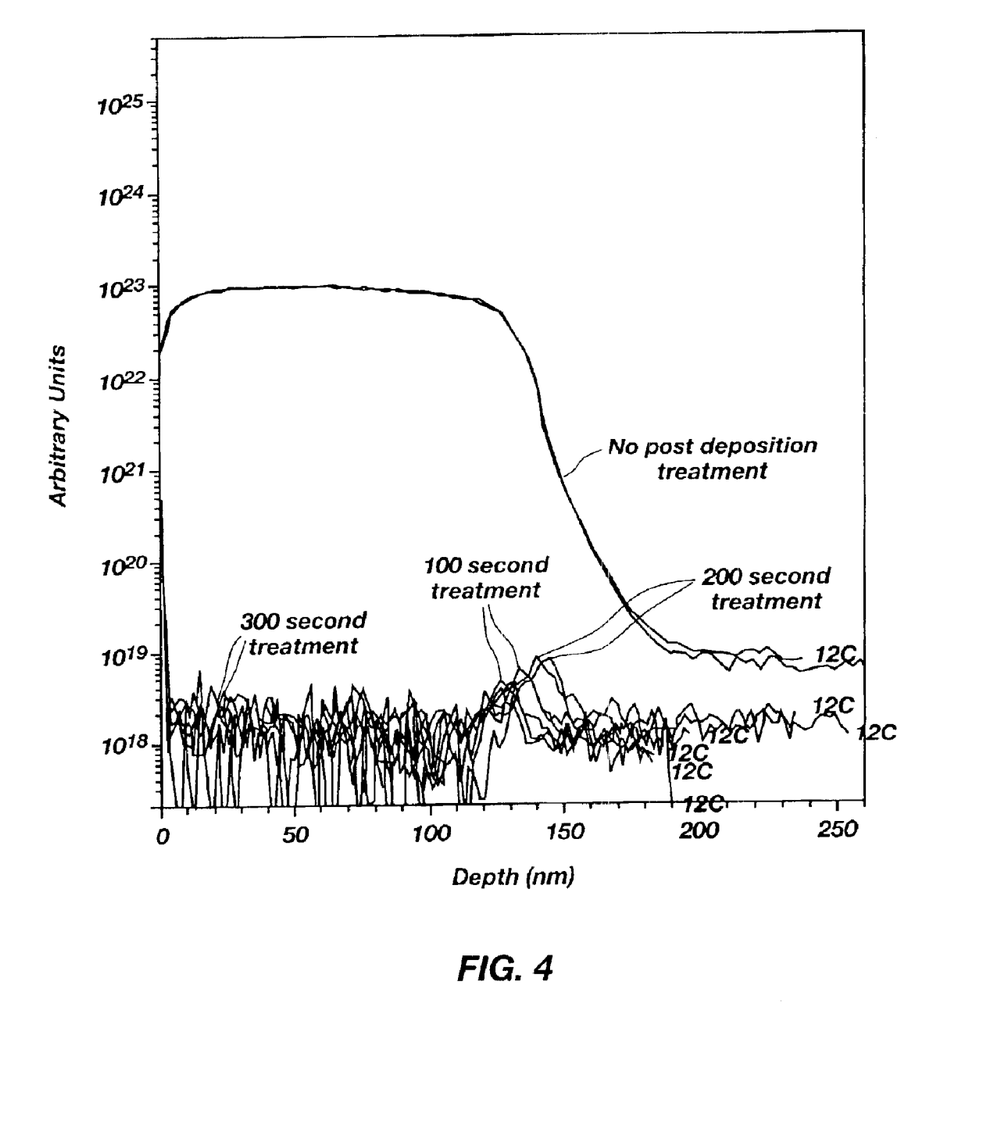

The insulative layer 10 was also exposed to $O_3$ at 530° C. for varying amounts of time. FIG. 4 shows a carbon depth profile comparison for insulative layers 10 exposed to $O_3$ for 100 seconds, 200 seconds, and 300 seconds. As shown in FIG. 4, exposure to $O_3$ for 100 seconds, 200 seconds, and 300 seconds drastically reduced the amount of carbon present in the insulative layer 10. These insulative layers 10 had an undetectable amount of carbon, as indicated by the noise or background amount of carbon shown in FIG. 4. As detected by SIMS analysis, a control insulative layer, which was not exposed to $O_3$, showed a significantly higher amount of carbon compared to the insulative layers 10 treated with $O_3$.

Figure 5:
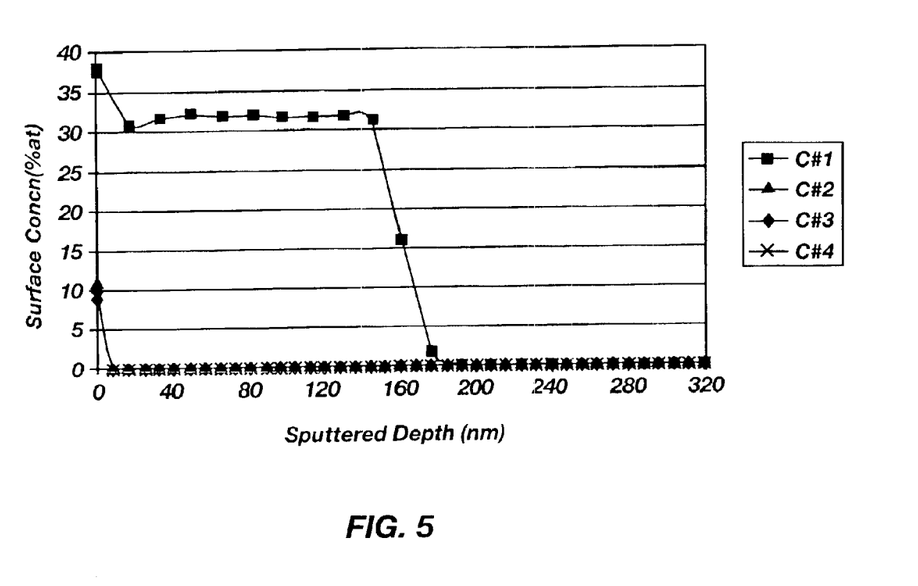

X-ray photoelectron spectroscopy ("XPS") analysis of the insulative layer 10, deposited as described above, that was not exposed to $O_3$ had approximately 37% carbon, as shown in plot C#1 of FIG. 5. FIG. 5 shows a comparison of carbon profiles for insulative layers 10 treated with $O_3$ compared to the insulative layer that was not exposed to $O_3$. Insulative layers 10 exposed to 20, 50, and 100 seconds of $O_3$ (plots C#2, C#3, and C#4, respectively) exhibited background amounts of carbon. As indicated by FIGS. 4 and 5, the carbon was removed to a depth of approximately 320 nm. FIG. 5 also shows that the surfaces of the insulative layers 10 have higher amounts of carbon while portions of the insulative layers 10 below the surfaces have drastically reduced amounts of carbon. This phenomenon is present in both the untreated insulative layer (plot C#1) and the treated insulative layers 10 (plots C#2, C#3, and C#4). The carbon on the surface is absorbed from the atmosphere, such as during storage, and is present at up to approximately 10% (atomic).

An insulative layer 10 formed from a spin-on, flowable oxide material may also be exposed to $O_3$ to remove residual carbon deposits if carbon deposits are present after the spin-on, flowable oxide material is deposited. Spin-on, flowable oxide materials are known in the art. Examples of these materials include, but are not limited to, the FOx® line of products from Dow Corning Corp. (Midland, Mich.), the FLARE™ and HOSP™ line of products from Honeywell Electronic Materials (Sunnyvale, Calif.), or the SiLK™ line of products from Dow Chemical Company (Midland, Mich.). These spin-on, flowable oxide materials are supplied in liquid form and may be deposited in the trench 8 of the semiconductor substrate 2 to form the insulative layer 10. The insulative layer 10 may be exposed to $O_3$, as previously described, to remove the residual carbon deposits.

After being exposed to $O_3$ to remove the residual carbon deposits, the semiconductor substrate 2 having the insulative layer 10 that is substantially free of residual carbon may be further processed, as known in the art, to produce the desired semiconductor device structure. For instance, planarization processes may be utilized to produce the semiconductor device structure.

While using $O_3$ to remove residual carbon deposits has been described for use in trench isolation applications, $O_3$ may also be used in other instances where residual carbon deposits are to be removed from flowable oxide materials or spin-on, flowable oxide materials. For instance, $O_3$ may be used to remove the residual carbon deposits present when these materials are used to fill gaps between metal lines or when the flowable oxide materials are used in low dielectric constant ("low K") applications.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope thereof as defined by the following appended claims.

What is claimed is:

1. A method of removing residual carbon deposits, comprising:

providing a flowable, insulative layer comprising silicon, carbon, and hydrogen; and exposing the flowable, insulative layer to a gas that consists essentially of ozone to remove residual carbon deposits from the flowable, insulative layer.

2. The method of claim 1, wherein providing a flowable, insulative layer comprises depositing the flowable, insulative layer by chemical vapor deposition.

3. The method of claim 1, wherein providing a flowable, insulative layer comprises providing a spin-on, flowable oxide material.

4. The method of claim 1, wherein exposing the flowable, insulative layer to a gas that consists essentially of ozone comprises exposing the flowable, insulative layer to a gas that further comprises an inert carrier gas.

5. The method of claim 1, wherein exposing the flowable, insulative layer to a gas that consists essentially of ozone comprises exposing the flowable, insulative layer to a concentration of ozone greater than approximately 1%.

6. The method of claim 1, wherein exposing the flowable, insulative layer to a gas that consists essentially of ozone comprises exposing the flowable, insulative layer to ozone at a temperature of between approximately 0° C. and approximately 1,000° C.

7. The method of claim 1, wherein exposing the flowable, insulative layer to a gas that consists essentially of ozone comprises exposing the flowable, insulative layer to ozone at a rate of between approximately 10 standard cubic centimeters per minute and approximately 20,000 standard cubic centimeters per minute.

8. A method of treating an intermediate semiconductor device structure to remove carbon deposits, comprising:
providing a semiconductor substrate comprising at least one trench;
forming an insulative layer in the at least one trench; and
exposing the insulative layer to a gas that consists essentially of ozone to remove residual carbon deposits from the insulative layer.

9. The method of claim 8, wherein forming an insulative layer in the at least one trench comprises depositing a flowable, insulative material comprising silicon, carbon, and hydrogen in the at least one trench.

10. The method of claim 9, wherein depositing a flowable, insulative material comprising silicon, carbon, and hydrogen in the at least one trench comprises completely filling the at least one trench with the flowable, insulative material.

11. The method of claim 9, wherein depositing a flowable insulative material comprising silicon, carbon, and hydrogen in the at least one trench comprises partially filling the at least one trench with the flowable, insulative material.

12. The method of claim 8, wherein forming an insulative layer in the at least one trench comprises forming the insulative layer by chemical vapor deposition.

13. The method of claim 12, wherein forming the insulative layer by chemical vapor deposition comprises flowing trimethylsilane and ozone over the semiconductor substrate.

14. The method of claim 12, wherein forming the insulative layer by chemical vapor deposition comprises flowing an organic silicon precursor and an oxidizing agent over the semiconductor substrate.

15. The method of claim 8, wherein forming an insulative layer in the at least one trench comprises depositing a spin-on, flowable oxide material in the at least one trench.

16. The method of claim 8, wherein exposing the insulative layer to a gas that consists essentially of ozone comprises exposing the insulative layer to a gas that further comprises an inert carrier gas.

17. The method of claim 8, wherein exposing the insulative layer to a gas that consists essentially of ozone comprises flowing the ozone over the semiconductor substrate at a rate of approximately 10 standard cubic centimeters per minute to approximately 20,000 standard cubic centimeters per minute.

18. The method of claim 8, wherein exposing the insulative layer to a gas that consists essentially of ozone comprises flowing the ozone over the semiconductor substrate at a rate of approximately 2,000 standard cubic centimeters per minute to approximately 5,000 standard cubic centimeters per minute.

19. The method of claim 8, wherein exposing the insulative layer to a gas that consists essentially of ozone comprises flowing the ozone over the semiconductor substrate at a concentration of ozone greater than approximately 1%.

20. The method of claim 8, wherein exposing the insulative layer to a gas that consists essentially of ozone comprises flowing the ozone over the semiconductor substrate at a concentration of ozone greater than approximately 12%.

21. The method of claim 8, wherein exposing the insulative layer to a gas that consists essentially of ozone comprises flowing the ozone over the semiconductor substrate at a concentration of ozone greater than approximately 17%.

22. The method of claim 8, wherein exposing the insulative layer to a gas that consists essentially of ozone comprises exposing the insulative layer to the ozone for a period of time sufficient to oxidize the residual carbon deposits.

23. The method of claim 8, wherein exposing the insulative layer to a gas that consists essentially of ozone comprises flowing the ozone over the semiconductor substrate at a temperature of between approximately 100° C. and approximately 1,000° C.

24. The method of claim 8, wherein exposing the insulative layer to a gas that consists essentially of ozone comprises flowing the ozone over the semiconductor substrate at a temperature of approximately 400° C. to approximately 700° C.

25. The method of claim 8, wherein exposing the insulative layer to a gas that consists essentially of ozone comprises exposing the insulative layer to the ozone for between approximately 20 seconds and approximately 300 seconds.

26. The method of claim 8, wherein exposing the insulative layer to a gas that consists essentially of ozone comprises exposing the insulative layer to the ozone for approximately 20 seconds.

27. The method of claim 8, wherein exposing the insulative layer to a gas that consists essentially of ozone comprises oxidizing the residual carbon deposits to volatile, carbon species.

28. The method of claim 8, wherein exposing the insulative layer to a gas that consists essentially of ozone comprises reducing an amount of carbon present in the insulative layer to less than approximately 5% atomic.

29. A method of treating an intermediate semiconductor device structure to remove carbon deposits, comprising:
providing a semiconductor substrate comprising at least one trench;
depositing a flowable oxide material in the at least one trench; and
introducing a gas that consists essentially of ozone into the at least one trench to remove residual carbon deposits present in the flowable oxide material.

30. The method of claim 29, wherein depositing a flowable oxide material in the at least one trench comprises depositing the flowable oxide material comprising silicon, carbon, and hydrogen in the at least one trench.

31. The method of claim 29, wherein depositing a flowable oxide material in the at least one trench comprises forming an insulative layer by chemical vapor deposition or depositing a spin-on, flowable oxide material in the at least one trench.

32. The method of claim 31, wherein forming the insulative layer by chemical vapor deposition comprises flowing an organic silicon precursor and an oxidizing agent over the semiconductor substrate.

33. The method of claim 31, wherein forming the insulative layer by chemical vapor deposition comprises flowing trimethylsilane and ozone over the semiconductor substrate.

34. The method of claim 29, wherein introducing a gas that consists essentially of ozone into the at least one trench to remove residual carbon deposits present in the flowable oxide material comprises flowing the ozone over the semiconductor substrate at a rate of approximately 10 standard cubic centimeters per minute to approximately 20,000 standard cubic centimeters per minute.

35. The method of claim 29, wherein introducing a gas that consists essentially of ozone into the at least one trench to remove residual carbon deposits present in the flowable oxide material comprises flowing the ozone over the semiconductor substrate at a rate of approximately 2,000 standard cubic centimeters per minute to approximately 5,000 standard cubic centimeters per minute.

36. The method of claim 29, wherein introducing a gas that consists essentially of ozone into the at least one trench to remove residual carbon deposits present in the flowable oxide material comprises flowing the ozone over the semiconductor substrate at a concentration of ozone greater than approximately 1%.

37. The method of claim 29, wherein introducing a gas that consists essentially of ozone into the at least one trench to remove residual carbon deposits present in the flowable oxide material comprises flowing the ozone over the semiconductor substrate at a concentration of ozone greater than approximately 12%.

38. The method of claim 29, wherein introducing a gas that consists essentially of ozone into the at least one trench to remove residual carbon deposits present in the flowable oxide material comprises flowing the ozone over the semiconductor substrate at a concentration of ozone greater than approximately 17%.

39. The method of claim 29, wherein introducing a gas that consists essentially of ozone into the at least one trench to remove residual carbon deposits present in the flowable oxide material comprises exposing the flowable oxide material to the ozone for a period of time sufficient to oxidize the residual carbon deposits.

40. The method of claim 29, wherein introducing a gas that consists essentially of ozone into the at least one trench to remove residual carbon deposits present in the flowable oxide material comprises flowing the ozone over the semiconductor substrate at a temperature of between approximately 100° C. and approximately 1,000° C.

41. The method of claim 29, wherein introducing a gas that consists essentially of ozone into the at least one trench to remove residual carbon deposits present in the flowable oxide material comprises flowing the ozone over the semiconductor substrate at a temperature of approximately 400° C. to approximately 700° C.

42. The method of claim 29, wherein introducing a gas that consists essentially of ozone into the at least one trench to remove residual carbon deposits present in the flowable oxide material comprises exposing the flowable oxide material to the ozone for between approximately 20 seconds and approximately 300 seconds.

43. The method of claim 29, wherein introducing a gas that consists essentially of ozone into the at least one trench to remove residual carbon deposits present in the flowable oxide material comprises exposing the flowable oxide material to the ozone for approximately 20 seconds.

44. The method of claim 29, wherein introducing a gas that consists essentially of ozone into the at least one trench to remove residual carbon deposits present in the flowable oxide material comprises oxidizing the residual carbon deposits to volatile, carbon species.

45. The method of claim 29, wherein introducing a gas that consists essentially of ozone into the at least one trench to remove residual carbon deposits present in the flowable oxide material comprises reducing an amount of carbon present in the flowable oxide material to less than approximately 5%.

46. The method of claim 29, wherein depositing a flowable oxide material in the at least one trench comprises completely filling the at least one trench with the flowable oxide material.

47. The method of claim 29, wherein depositing a flowable oxide material in the at least one trench comprises partially filling the at least one trench with the flowable oxide material.

48. A method of removing residual carbon deposits, comprising:
providing a flowable, insulative layer comprising silicon, carbon, and hydrogen; and
exposing the flowable, insulative layer to a concentration of ozone greater than approximately 1% to remove residual carbon deposits from the flowable, insulative layer.

49. The method of claim 48, wherein providing a flowable, insulative layer comprises depositing the flowable, insulative layer by chemical vapor deposition.

50. The method of claim 48, wherein providing a flowable, insulative layer comprises providing a spin-on, flowable oxide material.

51. The method of claim 48, wherein exposing the flowable, insulative layer to a concentration of ozone greater than approximately 1% comprises exposing the flowable, insulative layer to a concentration of ozone greater than approximately 12%.

52. The method of claim 48, wherein exposing the flowable, insulative layer to a concentration of ozone greater than approximately 1% comprises exposing the flowable, insulative layer to a concentration of ozone greater than approximately 17%.

53. The method of claim 48, wherein exposing the flowable, insulative layer to a concentration of ozone greater than approximately 1% comprises exposing the flowable, insulative layer to ozone at a rate of between approximately 10 standard cubic centimeters per minute and approximately 20,000 standard cubic centimeters per minute.

54. A method of removing residual carbon deposits, comprising:
providing a flowable, insulative layer comprising silicon, carbon, and hydrogen; and
exposing the flowable, insulative layer to ozone at a rate of between approximately 10 standard cubic centimeters per minute and approximately 20,000 standard cubic centimeters per minute to remove residual carbon deposits from the flowable, insulative layer.

55. The method of claim 54, wherein providing a flowable, insulative layer comprises depositing the flowable, insulative layer by chemical vapor deposition.

56. The method of claim 54, wherein providing a flowable, insulative layer comprises providing a spin-on, flowable oxide material.

57. The method of claim 54, wherein exposing the flowable, insulative layer to ozone comprises exposing the flowable, insulative layer to a concentration of ozone greater than approximately 1%.

* * * * *